United States Patent [19]

Bonnet

[11] Patent Number: 4,574,204
[45] Date of Patent: Mar. 4, 1986

[54] CIRCUIT FOR HOLDING A PULSE DURING A PREDETERMINED TIME INTERVAL AND AN IMPROVED MONOSTABLE MULTIVIBRATOR

[75] Inventor: Yves A. Bonnet, Saint Laurent Du Var, France

[73] Assignee: International Business Machines Corporation, Armonk, N.Y.

[21] Appl. No.: 405,804

[22] Filed: Aug. 6, 1982

[30] Foreign Application Priority Data

Sep. 8, 1981 [EP] European Pat. Off. ........ 81430029.9

[51] Int. Cl.⁴ ..................... H03K 3/284; H03K 3/33
[52] U.S. Cl. ................................. 307/273; 307/280; 307/445; 307/265
[58] Field of Search ............... 307/273, 280, 300, 266, 307/267, 265, 454, 605, 457, 606, 454

[56] References Cited

U.S. PATENT DOCUMENTS

| | | | |
|---|---|---|---|
| 3,312,839 | 4/1967 | Briley | 307/605 |
| 3,341,712 | 9/1967 | Lefferts | 307/266 |
| 3,394,268 | 7/1968 | Murphy | 307/280 |
| 3,578,988 | 5/1971 | Slowikowski | 307/265 |
| 3,585,512 | 6/1971 | Gassman | 307/280 |
| 3,641,369 | 2/1972 | Wallingford | 307/605 |
| 3,867,648 | 2/1975 | Christenson | 307/265 |

OTHER PUBLICATIONS

R. E. Hayes, "Step-recovery Action in Transistors", *Electronic Letters*, vol. 3, No. 4, p. 151 Apr. 1967.
P. Blomeyer, "Kleines LSL-Ptaktikum", *Technische Rundschau*, vol. 68, No. 15 Dec. 1976.

*Primary Examiner*—Stanley D. Miller
*Assistant Examiner*—Timothy P. Callahan
*Attorney, Agent, or Firm*—Douglas A. Lashmit; John A. Jordan; Edward W. Brown

[57] ABSTRACT

This invention relates to a circuit for holding a pulse at an up level during a time interval $\tau$ after the input signal has been removed, and to the use of the circuit to realize a monostable multivibrator. The holding circuit features a bipolar transistor that is driven into saturation by the application of an input signal in the form of a clock pulse. The hold circuit also features a control network including a diode and a drain resistor. Upon removal of the input signal the charge stored in the base of the saturated transistor is caused by the diode to flow in a controlled manner to the drain resistor so that the transistor is cut off after a time interval $\tau$ closely approximating the storage time $t_s$. Thus, the holding circuit provides a pulse of width $T+\tau$. A monostable multivibrator is obtained by connecting the holding circuit to one of the two inputs of a conventional NOR circuit. The other NOR circuit input receives the input clock pulse. Because of the absence of capacitors these circuits can readily be fabricated as a monolithic integrated form.

1 Claim, 3 Drawing Figures

CIRCUIT FOR HOLDING A PULSE DURING A PREDETERMINED TIME INTERVAL AND AN IMPROVED MONOSTABLE MULTIVIBRATOR

DESCRIPTION

Background of the Invention

This invention generally concerns semiconductor integrated switching circuits and more particularly an integrated circuit for holding an output pulse at a high level after the input signal has been removed and an improved integrated circuit monostable multivibrator including the holding circuit.

Monostable multivibrators are circuits which generate an output pulse whose initiation is synchronized with the rising or falling edge of an input pulse, but whose width is determined by specific circuit parameters rather than the width of the input pulse. As is well known, the width of the monostable multivibrator pulse can be determined by a length of delay line having inductance, capacitance and resistance or a network of resistance and capacitance alone.

Unfortunately, because it is difficult to build components conventionally used for controlling pulse width in integrated circuit form, it is difficult to build monostable multivibrator circuits in integrated form. Additionally, the construction problems are aggravated in the case of very large scale integrated (VLSI) circuits because in VLSI circuits, designers seek to pack greater numbers of components into the semiconductor chip, allowing only limited space for those components.

Because it is practically impossible to make inductors in an integrated circuit, pulse width control must be accomplished with resistance-capacitance (RC) networks. Additionally, because of the limitations in making capacitors in integrated form, integrated circuit pulse width control is yet further limited. Because integrated circuit capacitors take the form of parallel plate capacitors formed on the chip surface, it is difficult to exceed a capacitance value of 15 pf. To achieve a capacitance value on the order of 100 pf, it would require a silicon surface area of about 10 mm$^2$, or almost the total area of a conventional integrated circuit chip.

Additionally, because large area integrated circuit capacitors exhibit premature voltage breakdown due to pinholes in the dielectric, it is difficult to make capacitances of more than 15 pf without encountering reliability problems.

At present, to form a monostable multivibrator the device designers use a conventional integrated circuit to which a discrete external capacitor is connected. Unfortunately, this approach has a number of drawbacks. For example, the presence of the discrete external capacitor results in the need for additional space. Further, it is necessary to provide means for connecting the integrated circuit to the capacitor.

SUMMARY OF THE INVENTION

It is therefore an objective of the present invention to provide an integrated circuit means for controlling pulse width. Additionally, it is an objective of this invention to provide a monostable multivibrator in integrated form.

Briefly, this invention includes a holding circuit which responds to a rectangular pulse of width T to produce a synchronized rectangular pulse of width T+$\tau$, where $\tau$ is an adjustable time interval. The circuit in accordance with this invention features use of the turn-off delay of a conventional bipolar transistor previously driven into saturation to achieve the retention time $\tau$. The retention time $\tau$ is provided by the time taken for charges stored in the base of the transistor to be drained. Charge in the transistor base is drained in a controlled manner by means of a resistive path, the value of which is selected to control the retention time $\tau$. In this way, the circuit of this invention eliminates the need for a capacitor and the charging thereof as is conventionally done, to determine a time interval.

This invention further includes a non-capacitive monostable multivibrator which includes the holding circuit and a conventional NOR circuit. A clock signal is applied as one input to the NOR circuit, while the clock signal as processed by the holding circuit is provided as another input. Depending on the type of transistor being used, the output pulse of the NOR circuit is synchronized with either the rising edge or the falling edge of the clock signal, and has a width $\tau$, which is independent of the width T of the clock signal. Thus, the invention provides a monostable multivibrator that can be entirely formed on a very small portion of a silicon chip using conventional integrated circuit manufacturing techniques.

Other objectives, features and advantages of the invention will be apparent from the following more detailed description of a preferred embodiment of the invention as illustrated in the accompanying drawings.

DESCRIPTION OF THE DRAWINGS

Referring to FIG. 1, depicted is a monostable multivibrator circuit 10 in accordance with the present invention. Circuit 10 includes a first circuit section 11 and a second circuit section 12. First circuit section 11 is in the form of a conventional NOR circuit having an input A for receiving a clock signal. Circuit section 11 also has an output terminal B which acts as the output of multivibrator 10. Circuit section 12 is a hold circuit section in accordance with this invention and is connected to circuit section 11 so as to receive the clock signal at input A and to provide a control signal to the NOR circuit section 11 at the collector of transistor T4.

The NOR circuit section 11 includes transistors T1 and T2 along with resistors R1 to R4. The elements of circuit section 11 are arranged in the conventional NOR circuit manner by connecting the collectors of transistors T1 and T2 to a common resistor R1. Resistor R1 is in turn connected to a supply voltage VCC. The base of transistor T1 is connected to biasing resistors R2, R1 while the base of transistor T2 is connected to a biasing resistor R4.

The hold circuit section 12 includes a transistor T4, a diode D1 and resistors R5 and R6. In preferred form, D1 may be made by short-circuiting the collector base junction of a transistor. Associated with transistor T4 is a resistor R6. Resistor R6 is used to provide bias for transistor T4 and in conjunction with the poling of diode D1 acts to provide a discharge path for transistor T4's base when transistor T4 is saturated, as will be explained more fully hereinafter. For the purposes of simplicity, the hold circuit in accordance with this invention will be described in connection with monostable multivibrator 10.

Figure 1:
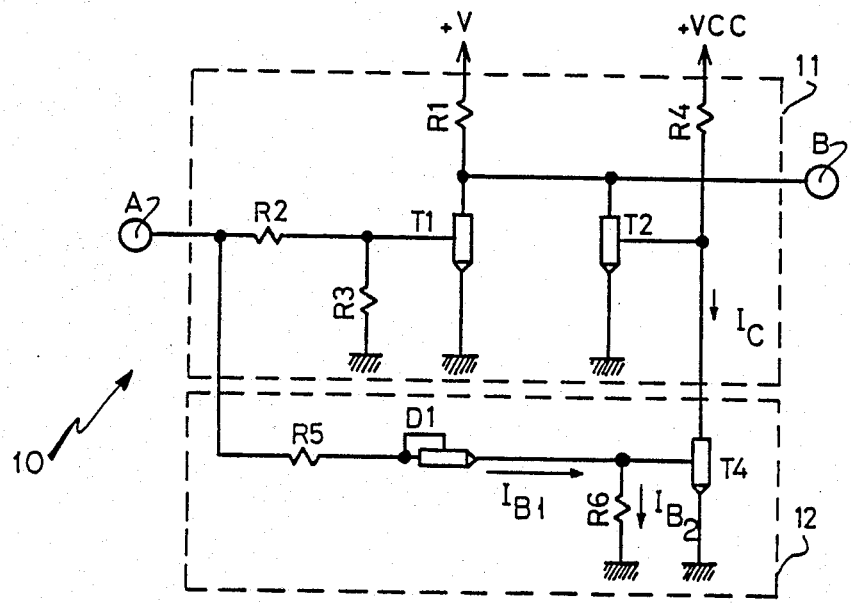
FIG. 1 is a schematic view of a monostable multivibrator in accordance with this invention.
Figure 2:
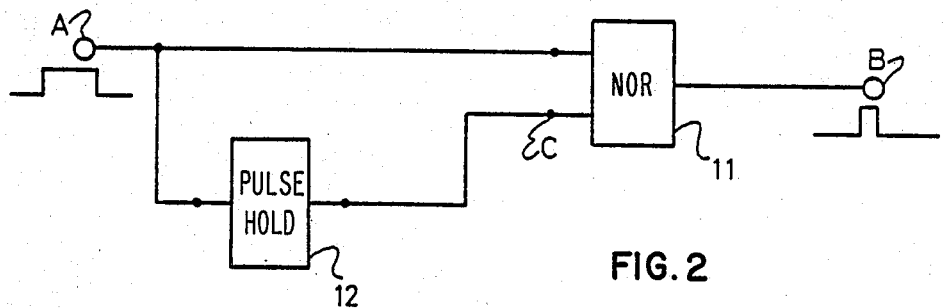
FIG. 2 is a block diagram of a monostable multivibrator in accordance with this invention.
Figure 3:
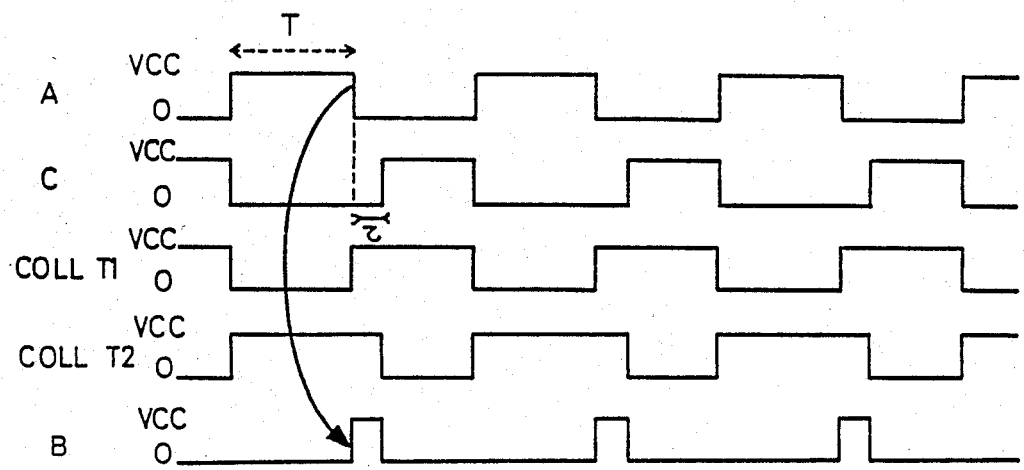
FIG. 3 is a timing diagram representing the signal levels at various points in the monostable multivibrator in accordance with this invention.

The operation of circuit 10 is described below with reference to FIG. 3. FIG. 3 shows the signals appearing within circuit 10 at circuit 10's input, i.e. point A, its output, i.e. point B, and the hold circuit output point C, better seen in FIG. 2 Additionally, FIG. 3 shows the signals at the collectors of transistors T1 and T2 of circuit section 11. The signals at the collectors of transistors T1 and T2 are shown individually, i.e. as if they were not interconnected, and with each collector being loaded by a resistor R1.

With reference to the figures, when a high level, for example equal to $V_{CC}$, is applied in the form of a clock signal to input A, transistor T1 is immediately driven into conduction. Accordingly, the potential at transistor T1's collector is caused to go from $V_{CC}$ to 0 volts. For simplicity, the delay in time due to transistor turn-on ($T_{on}$) and turn-off ($T_{off}$) which typically are on the order of 10 and 20 nanoseconds respectively have not been shown in the figure.

Continuing, as a result of the application of the high level at input terminal A, transistor T4 of circuit section 12 is immediately driven into saturation. Since, in accordance with this invention, the value of resistor R6 is selected to be much greater than the value of resistor R5 (R6>>R5) the base current of transistor T4 is in practice defined as $$I_{B1} = \frac{V_{CC} - V_D - (V_{BE})T4}{R5}$$

where $V_{CC}$ is the input voltage level at terminal A;
$V_D$ is the voltage drop across diode D1; and
$(V_{BE})T4$ is the junction voltage drop across the emitter base junction of transistor T4.

The DC beta ($\beta$) or forward current gain ($h_{fe}$) of transistor T4 at saturation is defined by the ratio $$\beta = I_{CMAX}/I_{B1}$$

At saturation, however, $$I_{CMAX} = V_{CC}/R4$$

Further, because $V_{CC}$ is larger than $V_D + (V_{EB})T4$, in practice $\beta \cong R5/R4$.

With transistor T4 in saturation, the base of transistor T2 is substantially at ground potential and accordingly, transistor T2 is quickly turned off. FIG. 3 shows the associated increase in collector voltage of transistor T2 as it turns off.

As the clock signal supplied at input terminal A is turned off, i.e. returns to the down level after time interval T, transistor T1 is turned off because of the low biasing resistance of its base. Accordingly, the collector voltage of transistor T1 quickly returns to $V_{CC}$.

With regard to circuit section 12, with clock signal at terminal A substantially at ground, in accordance with the invention, diode D1 is reversed biased and stored charges in the base of strongly saturated transistor T4 are unable to flow toward terminal A. Instead, stored transistor base charge flows into resistor R6. Thus, resistor R6 controls the stored charge drain rate and associated time of turn-off for transistor T4. The turn-off time, $T_{off}$, which is equal to the sum of storage time $t_s$ and the fall time $t_f$, is practially equal to $t_s$, since $t_s$ is defined by the known relation $$t_s = \tau_s \text{Log}_n \left[ \frac{|I_{B1}| + |I_{B2}|}{\left|\frac{I_{CMAX}}{\beta}\right| + |I_{B2}|} \right]$$

where
$\tau_s$ is the storage time constant and
$I_{B2}$ is the turn-off current of transistor T4 as defined by $$I_{B2} = \frac{(V_{BE})T4}{R6}$$

As noted, $I_{B1}$ is mainly dependent upon resistor R5. The parameters $\tau_s$ and $\beta$ are defined by the bipolar technology being used. The storage time $t_s$ is dependent upon a number of parameters, particularly resistor R6 and can readily be adjusted to the desired value.

After time interval $\tau$ close to $t_s$ transistor T4 is cut off. As a result, $V_{CC}$ again appears at the base of transistor T2 and transistor T2 is immediately rendered conductive. Accordingly, the output B which is connected to the collector of transistors T1 and T2 is caused to go to zero.

In summary, the operation of circuit 10 is as follows. Transistor T1 and T4 are initially off and transistor T2 is on. Accordingly, since the output B of circuit 10 is connected to both the collectors of transistors T1 and T2, terminal B is low because the collector of transistor T2 is low.

When a clock pulse is supplied to the input of circuit 10 at terminal A, both transistor T1 and transistor T4 turn on with transistor T4 going into saturation. Since transistor T4 is in saturation, transistor T2, in turn, turns off. In this condition, the output of circuit 10, i.e. terminal B, remains low since while the collector of transistor T2 has gone high, the collector of transistor T1 has gone low.

Subsequently, the input pulse at terminal A goes low, causing transistor T1 to turn off. Because both transistors T1 and T2 are off, their collectors go high causing the output at terminal B for circuit 10 to go high.

Since transistor T4 was in saturation, it remains on for a time interval $\tau$ until the stored base charge of transistor T4 can drain through resistor R6 and permit transistor T4 to turn off. When base stored charge has drained sufficiently, T4 falls out of conduction causing supply voltage $V_{CC}$ to appear at the base of transistor T2. With the appearance of supply voltage $V_{CC}$ at the base of transistor T2, transistor T2 turns on causing its collector and terminal B to go low thereby terminating the output pulse at the terminal B. In this way, the pulse width of the monostable multivibrator is determined as shown in the timing diagram of FIG. 3.

As shown in FIG. 3, the monostable multivibrator of this invention produces a pulse which exhibits a specific and adjustable width $\tau$ whose initiation is synchronized with the falling edge of the clock signal.

As an example, using a conventional NPN bipolar transistors having the following characteristics: $f_t \geq 400$ MHZ; $BV_{CEO} = 13$ V, $\beta > 30$ and assuming that transistor T4 has an $I_{CMAX}$ equal to 10 ma and that transistors T1, T2 and T3 have an $I_{CMAX}$ equal to 3 ma, it is possible to obtain a $\tau_s = 95$ ns for transistor T4 and $V_D=(V_{BE})T4=0.7$ V. Therefore, by choosing resistor R5=4K Ω, resistor R6=30K Ω and resistor R4=8K Ω it is possible to obtain in accordance with this invention $t_s=290$ ns, or $t_s=300$ ns. A conventional monostable multivibrator having a 10K Ω resistor and capable of producing 290 ns to 300 ns time would theoretically require a capacitance of 30 pf. In practice that value would typically be closer to approximately 50 pf. Such a capacitance would require a silicon area for the integrated circuit capacitor of approximately 4.5 mm$^2$.

Circuit 10 can be fabricated using either BIFET type hybrid technologies or conventional bipolar technology. The circuit is independent of whatever bipolar technology is used. Although parameters of transistor T4 will depend upon the specific technology involved, the desired value of $\tau$ can in all cases be obtained by adjusting the value of resistor R6.

It will be appreciated by those skilled in the art that while this circuit includes an NPN transistor it would be possible to implement a circuit including a PNP transistor. In the case where a PNP transistor is used, the output pulse would be generated at the rising edge of the clock pulse.

Hold circuit section 12 finds application in all cases where it is desirable to maintain an output pulse during a specific time interval $\tau$ after the input pulse has disappeared or to extend a duration of a given pulse by a time interval $\tau$.

The monostable multivibrator circuit 10 finds application in all cases where it is desirable to produce another pulse of a specific duration $\tau$ which is synchronized with the falling or rising edge of a clock pulse as will be appreciated by those skilled in the art. It can be used, for example, as a pulse generator, as a squaring circuit as a zero crossing detector or as a delay circuit.

While the circuits described hereinabove may be constructed with discrete components, the circuits lend themselves particularly well to implementation in a monolithic integrated circuit because of the complete absence of any capacitors.

Base charge storage phenomena and associated storage time $t_s$ inherent in any transistor, are generally regarded as detrimental to circuit operation since they result in a higher switching time period. Accordingly, the prior art has so far concentrated upon finding means to reduce the storage time as, for example, by connecting a Schottky Barrier diode in parallel with the base-collector junction or through the conventional use of a capacitor connected in parallel with the resistor that drives the base. In accordance with this invention, base charge storage time is used to advantage and provides a mechanism when combined with the circuitry described herein for realizing a holding circuit and monostable multivibrator without the need for capacitors.

While this invention has been described in connection with a preferred embodiment, it will be appreciated by those skilled in the art that various changes may be made without departing from the spirit of the invention.

I claim:

1. A monostable multivibrator for initiating an output pulse in response to the trailing edge of an input pulse, comprising:

input means connected to the base of a first transistor for receiving said input pulse;

output means connected to the collector of said first transistor and to the collector of a second transistor for providing said output pulse, the collectors of said first and second transistors being connected to a first voltage source and the emitters of said first and second transistors being grounded;

a third transistor having a collector connected to the base of said second transistor and to said first voltage source, an emitter connected to ground, and a base connected through a diode to said input means, wherein a charge is stored in the base of said third transistor when said input pulse is applied to said input means; and a base-emitter resistor connected between the base and the emitter of said third transistor for controllably dissipating the stored charge in said third transistor base, wherein the duration of said output pulse is determined by the value of said base-emitter resistor.

* * * * *